United States Patent
Fuhrmann et al.

(10) Patent No.: US 11,984,523 B2
(45) Date of Patent: May 14, 2024

(54) STACKED, MONOLITHIC, UPRIGHT METAMORPHIC, TERRESTRIAL CONCENTRATOR SOLAR CELL

(71) Applicant: AZUR SPACE Solar Power GmbH, Heilbronn (DE)

(72) Inventors: Daniel Fuhrmann, Heilbronn (DE); Wolfgang Guter, Stuttgart (DE); Matthias Meusel, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 16/826,777

(22) Filed: Mar. 23, 2020

(65) Prior Publication Data
US 2020/0303579 A1 Sep. 24, 2020

(30) Foreign Application Priority Data
Mar. 22, 2019 (DE) ...................... 10 2019 002 034.0

(51) Int. Cl.
| | | |
|---|---|---|
| H01L 31/0687 | (2012.01) | |
| H01L 31/078 | (2012.01) | |
| H01L 31/0304 | (2006.01) | |

(52) U.S. Cl.
CPC ........ H01L 31/0687 (2013.01); H01L 31/078 (2013.01); H01L 31/03046 (2013.01)

(58) Field of Classification Search
CPC ...................... H01L 31/0687; H01L 31/03046
See application file for complete search history.

(56) References Cited

U.S. PATENT DOCUMENTS

| | | |
|---|---|---|
| 8,962,991 B2 | 2/2015 | Jones-Albertus et al. |
| 10,439,091 B2 | 10/2019 | King et al. |
| (Continued) | | |

FOREIGN PATENT DOCUMENTS

| | | | |
|---|---|---|---|
| DE | 10 2015 016 047 A1 | 6/2017 | |
| EP | 1498960 A2 * | 1/2005 | ....... H01L 31/03046 |
| (Continued) | | | |

OTHER PUBLICATIONS

Dimroth, F., Beckert, R., Meusel, M., Schubert, U. and Bett, A.W. (2001), Metamorphic GayIn1-yP/Ga1-xInxAs tandem solar cells for space and for terrestrial concentrator applications at C> 1000 suns. Prog. Photovolt: Res. Appl., 9: 165-178. https://doi.org/10.1002/pip.362 (Year: 2001).*

(Continued)

Primary Examiner — Angelo Trivisonno
(74) Attorney, Agent, or Firm — Muncy, Geissler, Olds & Lowe, P.C.

(57) ABSTRACT

A stacked, monolithic, upright metamorphic, terrestrial concentrator solar cell having exactly five subcells and having a metamorphic buffer, wherein a first subcell has a first lattice constant G1 and consists essentially of germanium, a second subcell has a second lattice constant and GaInAs, a third subcell has the second lattice constant G2 and AlGaInAs, a fourth subcell has the second lattice constant G2 and InP, a fifth subcell has the second lattice constant G2 and InP, G1<G2 applies to the lattice constants, the metamorphic buffer is arranged between the first subcell and the second subcell and has the first lattice constant G1 on a bottom side facing the first subcell and the second lattice constant G2 on a top side facing the second subcell, and all of the semiconductor layers of the concentrator solar cell arranged above the first subcell are epitaxially produced on the preceding subcell.

20 Claims, 1 Drawing Sheet

(56) References Cited

U.S. PATENT DOCUMENTS

| | | | |
|---|---|---|---|
| 2009/0188554 | A1 | 7/2009 | Aiken |
| 2012/0138130 | A1* | 6/2012 | Guter .................. H01L 31/0687 257/104 |
| 2012/0216858 | A1 | 8/2012 | Jones-Albertus et al. |
| 2012/0285519 | A1* | 11/2012 | Hoffman, Jr. ......... H01L 31/078 136/255 |
| 2013/0263923 | A1 | 10/2013 | Jones-Albertus et al. |
| 2015/0280025 | A1 | 10/2015 | Bellanger et al. |
| 2016/0133775 | A1* | 5/2016 | Fuhrmann ............. H01L 31/056 136/246 |
| 2017/0069779 | A1* | 3/2017 | King ................... H01L 31/0352 |
| 2017/0110610 | A1* | 4/2017 | Derkacs ................ H01L 31/078 |
| 2017/0170354 | A1 | 6/2017 | Ebel et al. |
| 2018/0366609 | A1* | 12/2018 | Ritenour ........... H01L 31/03046 |
| 2018/0374973 | A1 | 12/2018 | Ebel et al. |

FOREIGN PATENT DOCUMENTS

| | | |
|---|---|---|
| EP | 2 251 912 A1 | 11/2010 |
| EP | 2 779 253 A1 | 9/2014 |
| EP | 2927968 A1 | 10/2015 |
| EP | 3 179 521 A1 | 6/2017 |
| EP | 3 419 060 A1 | 12/2018 |

OTHER PUBLICATIONS

Dimroth et al., "5-junction III-V solar cells for space applications," 3rd World Conference onPhotovoltaic Energy Conversion, 2003. Proceedings of, May 11-18, 2003 (Year: 2003).*

Strobl et al., "About Azur's "3G-30-advanced" Space Solar Cell And Next Generation Product With 35% Efficiency," 27th Annual European Photovoltaic Solar Energy Conference, and Exhibition (EU-PVSEC), pp. 104-108 (Sep. 2012).

Guter et al., "Development of Upright Metamorphic 4J Space Solar Cells," Space Power Workshop, Presentation, pp. 1-30 (2017).

Meusel et al., "European Roadmap for the Development of III-V Multijunction Space Solar Cells," Proc. of $19^{th}$ EU-PVSEC, pp. 3581-3586 (2004).

Patel et al., "Experimental Results from Performance Improvement and Radiation Hardening of Inverted Metamorphic Multi-Junction Solar Cells," IEEE Journal of Photovoltaics, pp. 1-6 (Jul. 2012).

Wanlass et al., "Progress toward an advanced four-subcell inverted metamorphic multi-junction (IMM) solar cell," Prog. Photovolt. Res. Appl., vol. 24, pp. 139-149 (Oct. 15, 2015).

Cornfeld et al., "Evolution of a 2.05 eV AlGaInP Top Sub-cell for 5 and 6J-IMM Applications," $38^{th}$ IEEE Photovoltaic Specialists Conference, pp. 1-4 (2012).

Liu et al., "Organometallic vapor phase epitaxy growth of upright metamorphic multijunction solar cells," J. of Crystal Growth, vol. 352, pp. 186-189 (2012).

Emmett E. Perl et al; "(Al)GaInP/GaAs Tandem Solar Cells for Power Conversion at Elevated Temperature and High Concentration" IEEE J. of Photovoltaics, vol. 8, No. Mar. 2, 2018, pp. 640-645.

* cited by examiner

STACKED, MONOLITHIC, UPRIGHT METAMORPHIC, TERRESTRIAL CONCENTRATOR SOLAR CELL

This nonprovisional application claims priority under 35 U.S.C. § 119(a) to German Patent Application No. 10 2019 002 034.0, which was filed in Germany on Mar. 22, 2019, and which is herein incorporated by reference.

BACKGROUND OF THE INVENTION

Field of the Invention

The present invention relates to a stacked, monolithic, upright metamorphic, terrestrial concentrator solar cell having exactly five subcells and having a metamorphic buffer.

Description of the Background Art

To make better use of the solar spectrum, multi-junction solar cells generally comprise three or more subcells with different, matched band gaps, wherein the topmost subcell has the largest band gap and the lowest subcell has the lowest band gap and the topmost subcell is located on the side of the multi-junction solar cell facing the sun.

Multi-junction solar cells are known, for example, from DE 10 2015 016 047 A1 (which corresponds to US 2017/0170354, which is incorporated herein by reference), EP 2 779 253 A1 (which corresponds to U.S. Ser. No. 10/439,091, and US 2012/0216858 A1 (which corresponds to U.S. Pat. No. 8,962,991).

The topmost subcell of a multi-junction solar cell, also referred to below as the top cell, often is formed of InGaP with a band gap of approximately 1.88 eV in the case of lattice-matched multi-junction solar cells on a germanium substrate.

The InGaP top cell shows an open terminal voltage $V_{oc}$ of about 1.4 V. To increase the efficiency of multi-junction solar cells, both metamorphic and lattice-matched concepts with more than three subcells are being pursued.

In order to achieve higher efficiencies, the use of multi-junction solar cells with 4 subcells has become mandatory in the meantime. However, the problem with the upright metamorphic AlGaInP/AlGaInAs/GaInAs/Ge four-junction solar cell, also known as UMM, is that the use of larger amounts of aluminum in the top two subcells, as is necessary to increase the band gap, leads to a deterioration in the material properties and thereby to a reduction in the solar cell efficiency. Due to the low minority charge carrier lifetime, e.g., the difference between the open terminal voltage (Voc) and energy band gap (Eg) is significantly higher than, e.g., with lattice-matched GaAs and GaInP solar cells.

In addition, the use of aluminum in the topmost subcell leads to a reduction in the mobility of the majority charge carriers in the emitter of the topmost solar subcell and thus to a significant increase in the sheet resistance in the multi-junction solar cell. The aforementioned effect is extremely relevant in the case of concentrator solar cells, which are typically operated at concentration factors of 500× to 1000×. Here, even a slightly increased series resistance, e.g., by a factor of 2, leads to a significant reduction in the efficiency of the multi-junction solar cell under concentration.

As a result, e.g., the AlGaInP/AlGaInAs/GaInAs/Ge four-junction solar cells with an Al-containing top cell have so far been developed for space applications. Due to the lack of concentration of solar light, the requirements for the sheet resistance are significantly lower than under concentration, so that series resistance losses have less of an impact on the overall efficiency of the multi-junction solar cell.

In addition, the space solar cell degrades in any case during its use in space due to the high-energy particle radiation, impinging there and including electrons and protons, so that a shorter minority charge carrier lifetime at the beginning of the mission (beginning-of-life, BOL) also has less of an impact on the critical end-of-life (EOL) efficiency at the end of the mission due to a reduced material quality for the aluminum-containing materials in comparison with the Al-free top cells used thus far.

For example, such an upright metamorphic AlGaInP/AlGaInAs/GaInAs/Ge four-junction solar cell for space applications is known from the publication "About AZUR's 3G30-advanced Space Solar Cell and Next Generation Product with 35% Efficiency" by Strobl et al., ISBN 3-936338-28-0. A corresponding multi-junction solar cell is known from the lecture "Development of Upright Metamorphic 4J Space Solar Cells" by W. Guter et al., Space Power Workshop 2017, Manhattan Beach, CA.

Furthermore, a lattice-matched five-junction solar cell for space applications with the material combination AlGaInP/GaInP/AlGaInAs/GaInAs/Ge is known from the publication "European Roadmap for the Development of III-V Multi-junction Space Solar Cells" by Meusel et al., Proc. of $19^{th}$ EU-PVSEC, Paris, 2004, pp. 3581-3586.

An inverted metamorphic five-junction solar cell for space applications is known from the publication "Experimental Results from Performance Improvement and Radiation Hardening of Inverted Metamorphic Multi-Junction Solar Cells" by Patel et al., IEEE Journal of Photovoltaics, July 2012. The energy band gaps of the subcells are 0.89 eV, 1.13 eV, 1.43 eV, 1.74 eV, and 2.05 eV, the top two subcells being made from lattice-matched materials.

In particular, when InAlGaP top cells are used in comparison with the Al-free InGaP top cell, it is disadvantageous, however, that, compared with an InGaP top cell, in this case there is an approximately five times higher sheet resistance. This leads to greater series resistance losses in the multi-junction solar cell for CPV applications, i.e., in concentrator applications, with higher currents in the ampere range.

Thus, it is known from the publication "Progress toward an advanced four-subcell inverted metamorphic multi-junction (IMM) solar cell" by Wanlass et al., Prog. Photovolt: Res. Appl. 2016, 24:139-149 DOI: 10.1002/pip.2609 that the fill factor in AlInGaP solar cells decreases significantly even at concentrations above 10 times the solar concentration due to the series resistance losses in the InAlGaP material.

Furthermore, it is known from the publication "Evolution of a 2.05 eV AlGaInP Top Subcell for 5 and 6J-IMM Applications" by Cornfeld et al., 2012 38th IEEE Photovoltaic Specialists Conference, 10.1109/PVSC.2012.6318171, that the open terminal voltage $V_{oc}$ of the topmost subcell of a stacked multi-junction solar cell can be increased by the addition of Al. However, the material quality is significantly worsened by the addition of Al, so that the diffusion length of the minority charge carriers decreases. At the same time, the series resistance increases, which leads to a reduction in the fill factor for Al-containing solar cells in measurements for applications with a concentration factor of one.

For concentrator applications, i.e., CPV applications, however, the losses for high currents have to be kept as low as possible. An alternative option for reducing higher series resistance losses is to significantly reduce the distance between the metal fingers on the top side of the InAlGaP top cell compared with the InGaP top cell. Although the resistance losses can in principle be compensated in this way, the approach leads to higher shading and thus also to a reduction in the efficiency of the entire solar cell.

In CPV applications in particular, i.e., concentrator applications with a factor of 100 and higher, it is therefore important to consider a sufficient transverse conductivity in order to keep the shading losses caused by the many metal fingers, i.e., grid fingers, as low as possible. Here, CPV applications generally have concentration factors between 500 and 1500.

The concept of a metamorphic multi-junction solar cell with more than 3 subcells is therefore not suitable for concentrator applications.

By increasing the lattice constant by the metamorphic buffer, the band gap of all In-containing subcells is reduced.

Regardless of the multi-junction solar cell concept used, a top cell with a high band gap is still required for a high overall efficiency. This can also be realized for upright metamorphic solar cells by the addition of Al but the Al content must be selected as significantly higher due to the higher In content of the top cell in comparison with lattice-matched concepts or inverted-metamorphic concepts, in order to reach a comparable band gap.

However, the higher Al content of the top cell leads to an additional intensification of the problems arising with Al-containing top cells in regard to sheet resistance and material quality.

SUMMARY OF THE INVENTION

It is therefore an object of the present invention to provide a device that refines the prior art.

According to an exemplary embodiment of the invention, a stacked, monolithic, upright metamorphic, terrestrial concentrator solar cell having exactly five subcells and having a metamorphic buffer is provided.

A first subcell has a first lattice constant G1 and a first band gap B1 and consists essentially of germanium.

A second subcell is arranged above the first subcell and has a second lattice constant G2 and a second band gap B2 and comprises a compound of GaInAs or consists essentially of GaInAs.

A third subcell is arranged above the second subcell and has the second lattice constant G2 and a third band gap B3 and comprises AlGaInAs or consists essentially of AlGaInAs.

A fourth subcell is arranged above the third subcell and has the second lattice constant G2 and a fourth band gap B4 and comprises a compound of InP.

A fifth subcell is arranged above the fourth subcell and has the second lattice constant G2 and a fifth band gap B5 and comprises InP.

B1<B2<B3<B4<B5 applies to the band gaps and G1<G2 applies to the lattice constants.

The metamorphic buffer is arranged between the first subcell and the second subcell and has the first lattice constant G1 on a bottom side facing the first subcell and the second lattice constant G2 on a top side facing the second subcell. It is understood that the first lattice constant G1 is 5.66 Å, i.e., corresponds to the lattice constant of Ge.

In addition, all of the semiconductor layers of the concentrator solar cell arranged above the first subcell are epitaxially produced on the preceding subcell.

The five subcells and the metamorphic buffer are each layered, therefore, formed as a semiconductor layer.

Together, the subcells and the metamorphic buffer and possibly further layers, e.g., tunnel diodes, form a stack.

The first subcell is formed, for example, as a substrate. All further semiconductor layers, therefore, in particular the four further subcells and the metamorphic buffer, are each epitaxially produced on an immediately preceding semiconductor layer of the stack, e.g., by means of MOVPE or by means of LPE or MBE.

In particular, the stack of the concentrator solar cell of the invention does not comprise a semiconductor bond.

It is understood that the term "concentrator solar cell" in the present case can mean a multi-junction solar cell with exactly five subcells, the solar cell being used for concentrator applications with a concentration factor above 500.

It should be noted that the respective subcells are formed as n-over-p subcells; i.e., the subcells each have an n-doped emitter layer and a p-doped base layer. Here, the emitter is preferably integrally bonded to the base.

It should also be noted that a tunnel diode is formed between two immediately successive subcells. The tunnel diode formed between the first and second subcells can be arranged both between the first subcell and the metamorphic buffer or between the metamorphic buffer and the second subcell.

The emitter layer is preferably arranged above the base layer, so that light first penetrates the emitter layer and then the base layer. It is understood that the tunnel diodes each formed of a thin, highly n-doped layer and a thin, highly p-doped layer, and the two layers of the tunnel diode are arranged one on top of the other.

Furthermore, it should be noted that the n-emitter and p-base of the respective subcells can be formed of the same material, but with a different doping. Here the term "material" can be understood to mean a given compound of III-V elements.

In alternative embodiments, the emitter layer and the base layer of a subcell have different III-V compounds. Such subcells are called heterocells.

An advantage of the design of the invention of a multi-junction solar cell for concentrator applications is that the entire 5-junction solar cell can be produced monolithically in one growth process by using the upright metamorphic growth. In this way, in comparison with other multi-junction solar cell concepts such as inverted metamorphic or wafer-bonded concepts, the costs can be significantly reduced and the processing of the epitaxially deposited layer structures into solar cells can be carried out using previously established standard processes.

An advantage of the arrangement with five subcells is that no Al or only less than 1% Al is incorporated in the fourth subcell.

An advantage of the arrangement with five subcells is that no Al or only less than 5% Al or only less than 35% Al is incorporated in the fifth subcell, a low sheet resistance, in particular of less than 1500Ω/☐ or less than 1000Ω/☐, being achieved nevertheless. The fifth subcell consists essentially of AlInGaP, and the indium content is greater than 63%, and an emitter layer resistance is less than 1500Ω/cm2 or less than 1000Ω/cm2. The fifth subcell is formed as a heterocell, and the aluminum content of the base is higher than the aluminum content of the emitter. The fifth subcell is formed as a heterocell such that the base is formed from AlInGaP and the emitter is formed from InGaP. The fifth subcell consists essentially of AlInGaP and has an indium content greater than 63% and an aluminum content less than 25% or less than 37%, in each case based on the group III elements. The fourth subcell and/or the fifth subcell have an aluminum content, based on the group III elements, of 0% or less than 5% or less than 1%. The fourth subcell and/or the fifth subcell has GaInP or consists essentially of GaInP.

It is noted that the expression "consisting essentially of" a specified element or a specified compound of, for example, two, three, or four elements means that the corresponding semiconductor layer, e.g., subcell, consists substantially of the specified materials or, if applicable, apart from the specified elements, it additionally has impurities and/or dopants, e.g., zinc or silicon or tin or carbon.

The term "comprising" a specified element or a specified combination of elements, e.g., InP, by contrast means that in addition to the expressly specified elements, the semiconductor layer has or comprises, if applicable, further elements, in particular further main group III and/or V elements, e.g., aluminum, therefore consists essentially of a compound of the elements specified with further elements, in particular from main group III and/or V. A semiconductor layer having InP, e.g., a subcell, thus includes, for example, an InGaP layer or also an AlInGaP layer.

An advantage of forming the first subcell from germanium is that the first subcell can be produced simply and inexpensively, for example, by activating a germanium substrate by means of As and/or P diffusion during the process of metalorganic vapor phase epitaxy (MOVPE).

In particular, for the formation of the first subcell, no germanium layers that are several micrometers thick, i.e., so-called bulk layers, need to be epitaxially deposited to absorb the photons. As a result, the first subcell has low manufacturing costs.

It is also understood that production-related fluctuations in the lattice constants, in particular the second lattice constants, can be present across layers or subcells or that the second lattice constant can vary at least slightly from layer to layer or from subcell to subcell. In other words, the second lattice constants of the second, third, fourth, and fifth subcells each differ from one another by less than 0.2%.

In addition, it is noted that in the concentrator solar cell, the incidence of light always occurs first through the fifth subcell.

An advantage of the concentrator solar cell of the invention is that thanks to the material combination, on the one hand, the terrestrial solar spectrum is utilized particularly well and, on the other hand, a sufficiently high transverse conductivity is ensured in the topmost subcells. For this purpose, due to the metamorphic buffer the second lattice constant can be adjusted by the lattice constant of Ge such that even at high current loads due to concentration factors above 500, especially the topmost subcell, which is a few 100 nm thick, i.e., the fifth subcell, has a substantially low-resistance transverse conductivity in comparison with previous Al-containing subcells. This increases the efficiency of the entire concentrator cell.

In a first embodiment, the fourth subcell and/or the fifth subcell has GaInP or consists essentially of GaInP.

In a refinement, the fourth subcell has an aluminum content of 0% or less than 3% or less than 1%. According to another refinement, the fifth subcell has an aluminum content of less than 10% or less than 25% or less than 35%, based in each case on the group III elements.

For example, the fourth subcell consists essentially of GaInP and the fifth subcell of AlGaInP with a correspondingly low aluminum content below 10% or below 25% or below 35%, based in each case on the group III elements.

According to another embodiment, a layer thickness of the second subcell and/or a layer thickness of the third subcell is greater than 1 µm and less than 3.5 µm.

A layer thickness of the fourth subcell and/or a layer thickness of the fifth subcell is preferably greater than 100 nm and less than 1.5 µm.

In another refinement, the metamorphic buffer has a sequence of at least three and at most ten layers and/or a layer thickness of at least 0.5 µm and at most 4 µm. The metamorphic buffer is arranged between the first subcell and the second subcell and has the first lattice constant on a bottom side facing the first subcell and has the second lattice constant on a top side facing the second subcell, where the first lattice constant is less than the second lattice constant.

The metamorphic buffer is preferably highly n-doped or highly p-doped and is formed, for example, from InGaAs.

In particular, the metamorphic buffer layer sequence preferably has a dopant concentration greater than $5 \cdot 10^{17}$ N/cm$^3$ and a layer thickness above 0.5 µm and less than 20 µm.

In one embodiment, the metamorphic buffer consists essentially of multiple In$_x$Ga$_{1-x}$As layers with x being different and/or constant from layer to layer.

It is understood that the lattice constant changes at least once within the buffer. According to a first embodiment, the lattice constant increases, for example, from layer to layer, starting from a lowest layer of the sequence with the first lattice constant to the topmost layer of the sequence with the second lattice constant.

Alternatively, the lattice constant initially increases from layer to layer starting from the lowest layer of the sequence and then decreases or else first decreases and then increases. The increase or decrease in the lattice constants over the entire sequence is either step-like or linear or has any other form.

In another embodiment, the second subcell has a lattice constant greater than $5.72 \cdot 10^{-10}$ m, therefore greater than 5.72 Å, and/or a band gap greater than 1.07 eV and/or an indium content less than 24.5%.

According to a further embodiment, the third subcell has a band gap between 1.34 eV and 1.45 eV, or between 1.3 eV and 1.5 eV.

The fourth subcell preferably has a band gap between 1.61 eV and 1.69 eV or between 1.58 eV and 1.72 eV.

The fifth subcell preferably has a band gap between 1.8 eV and less than 2.05 eV or less than 1.98 eV and preferably greater than 1.75 eV.

According to a further refinement, the concentrator solar cell has a window layer, wherein the window layer is arranged above the fifth subcell and has a lattice constant that is at least 0.5% or at least 0.7% lower than the second lattice constant. The slightly strained window layer helps to achieve an optically transparent top side of the solar cell stack.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
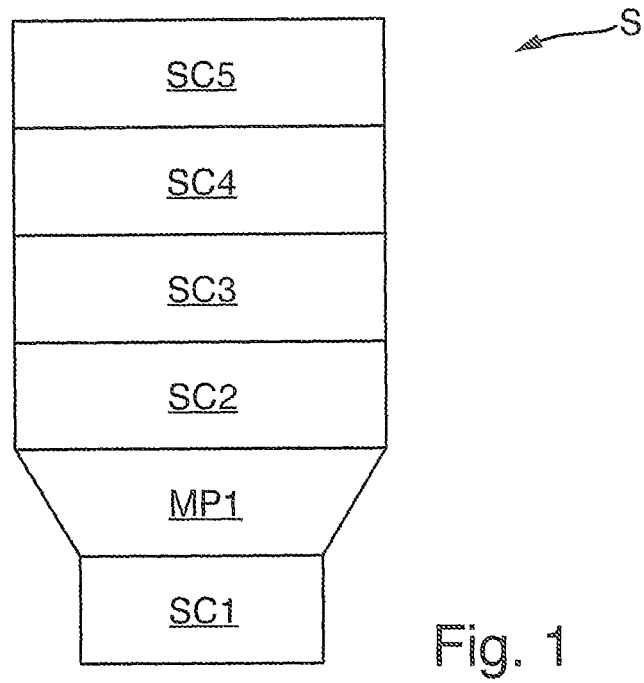
FIG. 1 shows a schematic cross section of an exemplary embodiment of the invention of a stacked concentrator solar cell.

The diagram in FIG. 1 shows a stacked, monolithic, upright metamorphic, terrestrial concentrator solar cell S having exactly five subcells SC1, SC2, SC3, SC4, and SC5 and having a metamorphic buffer MP1 arranged between first subcell SC1 and second subcell SC2.

First subcell SC1 consists essentially of germanium and has a corresponding first lattice constant and a first band gap. The further subcells SC2, SC3, SC4, and SC5 all have a second lattice constant G2, wherein second lattice constant G2 is greater than first lattice constant G1.

The transition between the two different lattice constants G1 and G2 of the stack is achieved by means of metamorphic buffer MP1, wherein metamorphic buffer MP1 for this purpose has first lattice constant G1 on a bottom side facing first subcell SC1 and second lattice constant G2 on a top side facing second subcell SC2.

The lattice constants are illustrated using the width of the respective semiconductor layer.

The second, third, fourth, and fifth subcells SC2, SC3, SC4, and SC5 each have a band gap B2, B3, B4, and B5, respectively, with B1<B2<B3<B4<B5.

Figure 2:
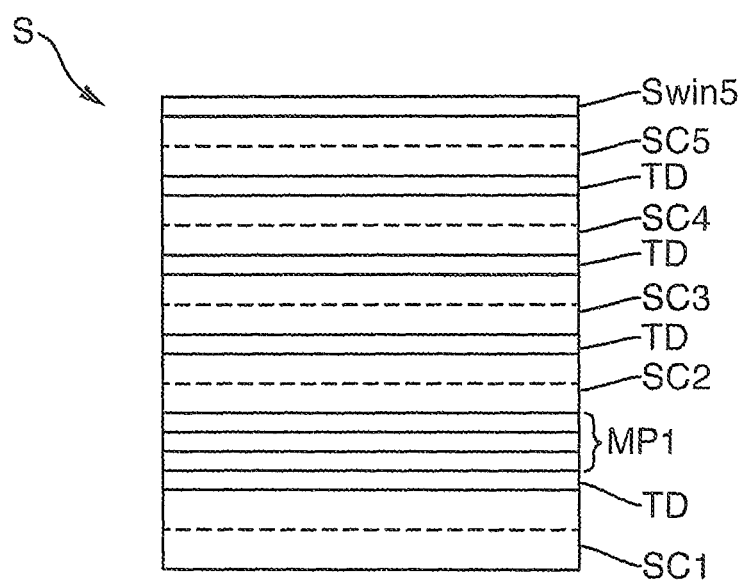
FIG. 2 shows a schematic cross section of an exemplary embodiment of the invention of a stacked concentrator solar cell.

A further embodiment is shown in the diagram in FIG. 2. Only the differences from the diagram in FIG. 1 will be explained below.

Each subcell SC1 to SC5 of the concentrator solar cell S has an emitter layer and a base layer, which are each indicated in FIG. 2 by dashed lines. In addition, a tunnel diode TD is arranged between two successive subcells of concentrator solar cell S. Tunnel diode TD arranged between first subcell SC1 and second subcell SC2 is arranged below metamorphic buffer MP1.

Metamorphic buffer MP1 consists essentially of a sequence of three semiconductor layers, wherein the lower layer has first lattice constant G1, the upper layer second lattice constant G2, and the middle layer a third lattice constant G3 with G1<G2<G3.

According to alternative embodiments (not shown), the sequence comprises more than three semiconductor layers and/or the lattice constant increases from layer to layer up to a maximum and then decreases again from layer to layer to the value of second lattice constant G2.

According to a further embodiment (not shown), tunnel diode TD arranged between first subcell SC1 and second subcell SC2 is arranged above metamorphic buffer MP1.

Implementation examples may be described in the following numbered clauses:

Clause 1. A stacked, monolithic, upright metamorphic, terrestrial concentrator solar cell may include exactly five subcells and a metamorphic buffer, wherein a first subcell has a first lattice constant and a first band gap and consists essentially of germanium, wherein a second subcell is arranged above the first subcell and has a second lattice constant and a second band gap, and comprises GaInAs or consists essentially of GaInAs, wherein a third subcell is arranged above the second subcell and has the second lattice constant and a third band gap, and comprises AlGaInAs or consists essentially of AlGaInAs, wherein a fourth subcell is arranged above the third subcell and has the second lattice constant and a fourth band gap, and comprises InP, wherein a fifth subcell is arranged above the fourth subcell and has the second lattice constant and a fifth band gap, and comprises InP, wherein the first bandgap<than the second bandgap<the third bandgap<the fourth bandgap<fifth bandgap, wherein the first lattice constant<the second lattice constant, wherein the metamorphic buffer is arranged between the first subcell and the second subcell and has the first lattice constant on a bottom side facing the first subcell and has the second lattice constant on a top side facing the second subcell, wherein all of the semiconductor layers of the concentrator solar cell arranged above the first subcell are epitaxially produced on the preceding subcell, and wherein the fifth subcell consists essentially of AlInGaP, wherein the indium content is greater than 63%, and an emitter layer resistance is less than $1500\Omega/cm^2$ or less than $1000\Omega/cm^2$.

Clause 2. The concentrator solar cell according to Clause 1, wherein the fourth subcell and/or the fifth subcell has GaInP or consists essentially of GaInP.

Clause 3. The concentrator solar cell according to Clause 2, wherein the fourth subcell and/or the fifth subcell have an aluminum content, based on the group III elements, of 0% or less than 5% or less than 1%.

Clause 4. The concentrator solar cell according to Clause 1, wherein the fifth subcell consists essentially of AlInGaP and has an indium content greater than 63% and an aluminum content less than 25% or less than 37%, in each case based on the group III elements.

Clause 5. The concentrator solar cell according to Clause 1, wherein the fifth subcell is formed as a heterocell, and wherein the aluminum content of the base is higher than the aluminum content of the emitter.

Clause 6. The concentrator solar cell according to Clause 1, wherein the fifth subcell is formed as a heterocell, wherein the base is formed from AlInGaP and the emitter is formed from InGaP.

Clause 7. The concentrator solar cell according to Clause 1, wherein a layer thickness of the second subcell and/or a layer thickness of the third subcell is greater than 1 μm and less than 5 μm.

Clause 8. The concentrator solar cell according to Clause 1, wherein a layer thickness of the fourth subcell and/or a layer thickness of the fifth subcell is greater than 100 nm and less than 500 nm or less than 1.5 μm.

Clause 9. The concentrator solar cell according to Clause 1, wherein the metamorphic buffer has a sequence of at least three and at most ten layers and/or that the metamorphic buffer has a layer thickness of at least 0.5 μm and at most 4 μm.

Clause 10. The concentrator solar cell according to Clause 1, wherein the second subcell has a lattice constant greater than $5.72 \cdot 10^{-10}$ m and/or a band gap greater than 1.07 eV and/or an indium content less than 24.5%.

Clause 11. The concentrator solar cell according to Clause 1, wherein the third subcell has a band gap between 1.34 eV and 1.45 eV or between 1.3 eV and 1.5 eV.

Clause 12. The concentrator solar cell according to Clause 1, wherein the fourth subcell has a band gap between 1.61 eV and 1.69 eV or between 1.58 eV and 1.72 eV.

Clause 13. The concentrator solar cell according to Clause 1, wherein the fifth subcell has a band gap<2.05 eV or less than 1.98 eV or wherein the fifth subcell has a band gap greater than 1.74 eV.

Clause 14. The concentrator solar cell according to Clause 1, wherein the concentrator solar cell has a window layer, wherein the window layer is arranged above the fifth subcell and has a lattice constant that is at least 0.5% or at least 0.7% lower than the fourth lattice constant.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked, monolithic, upright metamorphic, terrestrial concentrator solar cell comprising:
   exactly five subcells; and
   a metamorphic buffer,
   wherein a first subcell has a first lattice constant and a first band gap and consists essentially of germanium,
   wherein a second subcell is arranged above the first subcell and has a first second lattice constant and a second band gap, and comprises GaInAs or consists essentially of GaInAs,
   wherein a third subcell is arranged above the second subcell and has a second second lattice constant and a third band gap, and comprises AlGaInAs or consists essentially of AlGaInAs,
   wherein a fourth subcell is arranged above the third subcell and has a third second lattice constant and a fourth band gap, and comprises InP,
   wherein a fifth subcell is arranged above the fourth subcell and has a fourth second lattice constant and a fifth band gap, and comprises InP,
   wherein the first band gap is less than the second band gap which is less than the third band gap which is less than the fourth band gap which is less than fifth band gap,
   wherein the first lattice constant is less than the first, second, third, and fourth second lattice constants,
   wherein the metamorphic buffer is arranged between the first subcell and the second subcell and has the first lattice constant on a bottom side facing the first subcell and has the first second lattice constant on a top side facing the second subcell,
   wherein all semiconductor layers of the concentrator solar cell arranged above the first subcell are epitaxially produced on a preceding subcell,
   wherein the fifth subcell comprises a base layer and an emitter layer, and consists essentially of AlInGaP, with an aluminum content less than 25% and an indium content greater than 63%, based on group III elements,
   wherein an emitter layer resistance of the emitter layer of the fifth subcell is less than 1500 Ω/square or less than 1000 Ω/square,
   wherein the first, second, third, and fourth second lattice constants differ from one another by less than 0.2%,
   wherein any of the first, second, third, and fourth second lattice constants is greater than $5.72 \cdot 10^{-10}$ m, and
   wherein the fifth subcell has a band gap less than 1.98 eV and greater than 1.74 eV.

2. The concentrator solar cell according to claim 1, wherein the fourth subcell has GaInP or consists essentially of GaInP.

3. The concentrator solar cell according to claim 2, wherein the fourth subcell have an aluminum content, based on the group III elements, of 0% or less than 5% or less than 1%.

4. The concentrator solar cell according to claim 1, wherein a layer thickness of the second subcell and/or a layer thickness of the third subcell is greater than 1 μm and less than 5 μm.

5. The concentrator solar cell according to claim 1, wherein a layer thickness of the fourth subcell and/or a layer thickness of the fifth subcell is greater than 100 nm and less than 500 nm or less than 1.5 μm.

6. The concentrator solar cell according to claim 1, wherein the metamorphic buffer has a sequence of at least three and at most ten layers and/or that the metamorphic buffer has a layer thickness of at least 0.5 μm and at most 4 μm.

7. The concentrator solar cell according to claim 1, wherein the second subcell has a band gap greater than 1.07 eV and/or an indium content less than 24.5%.

8. The concentrator solar cell according to claim 1, wherein the third subcell has a band gap between 1.34 eV and 1.45 eV or between 1.3 eV and 1.5 eV.

9. The concentrator solar cell according to claim 1, wherein the fourth subcell has a band gap between 1.61 eV and 1.69 eV or between 1.58 eV and 1.72 eV.

10. The concentrator solar cell according to claim 1, wherein the concentrator solar cell has a window layer, wherein the window layer is arranged above the fifth subcell and has a lattice constant that is at least 0.5% or at least 0.7% lower than the fourth second lattice constant.

11. The concentrator solar cell of claim 1, wherein
   the metamorphic buffer has a sequence of layers, and
   a lattice constant of the metamorphic buffer increases starting from a lowest layer of the sequence with the first lattice constant to an uppermost layer of the sequence with the first second lattice constant.

12. The concentrator solar cell of claim 11, wherein the lattice constant of the metamorphic buffer increases from layer to layer.

13. The concentrator solar cell of claim 1, wherein
   the metamorphic buffer has a sequence of layers, and
   a lattice constant of the metamorphic buffer first increases starting from a lowest layer of the sequence and then decreases from layer to layer, or first decreases and then increases.

14. The concentrator solar cell of claim 1, wherein
   the metamorphic buffer has a sequence of layers,
   the sequence of layers of the metamorphic buffer comprises more than three semiconductor layers, and
   a lattice constant of the metamorphic buffer increases from layer to layer starting at a lowest layer of the sequence up to a maximum and then decreases from layer to layer up to the first second lattice constant at an uppermost layer of the sequence.

15. The concentrator solar cell of claim 1, wherein a tunnel diode is arranged between the first subcell and the second subcell.

16. The concentrator solar cell of claim 1, wherein a corresponding tunnel diode is arranged between each two successive subcells of the concentrator solar cell.

17. The concentrator solar cell of claim 16, wherein the tunnel diode arranged between the first subcell and the second subcell is arranged below the metamorphic buffer.

18. The concentrator solar cell of claim 1, wherein the metamorphic buffer has a dopant concentration greater than $5 \cdot 10^{17}$ 1 cm$^3$.

19. The concentrator solar cell according to claim 1, wherein the fifth subcell is formed as a heterocell, and wherein an aluminum content of the base layer of the fifth subcell is higher than an aluminum content of the emitter layer of the fifth subcell.

20. The concentrator solar cell according to claim 1, wherein a layer thickness of the third subcell is greater than 1 μm and less than 5 μm.

* * * * *